(12) United States Patent
Koo et al.

(10) Patent No.: US 12,106,879 B2
(45) Date of Patent: Oct. 1, 2024

(54) NANO SPINTRONIC DEVICE USING SPIN CURRENT OF FERROMAGNETIC MATERIAL AND HEAVY METAL CHANNEL

(71) Applicant: KOREA INSTITUTE OF SCIENCE AND TECHNOLOGY, Seoul (KR)

(72) Inventors: Hyun Cheol Koo, Seoul (KR); Ki Hyuk Han, Seoul (KR); Dong Soo Han, Seoul (KR); Ouk Jae Lee, Seoul (KR); Byoung Chul Min, Seoul (KR); Hyung Jun Kim, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 421 days.

(21) Appl. No.: 17/525,855

(22) Filed: Nov. 12, 2021

(65) Prior Publication Data
US 2023/0005651 A1    Jan. 5, 2023

(30) Foreign Application Priority Data
Jul. 1, 2021   (KR) .......................... 10-2021-0086202

(51) Int. Cl.
*H01F 10/32*    (2006.01)
*H10N 50/80*    (2023.01)

(52) U.S. Cl.
CPC .......... *H01F 10/329* (2013.01); *H10N 50/80* (2023.02); *H01F 10/3259* (2013.01)

(58) Field of Classification Search
None
See application file for complete search history.

(56) References Cited

U.S. PATENT DOCUMENTS

| | | | | |
|---|---|---|---|---|
| 9,691,463 | B1* | 6/2017 | Worledge | G11C 11/1675 |
| 10,424,357 | B2* | 9/2019 | Tzoufras | H01F 10/329 |
| 11,158,672 | B2* | 10/2021 | Sonobe | H10N 50/80 |
| 2018/0114898 | A1* | 4/2018 | Lee | G11C 11/1659 |
| 2019/0035446 | A1* | 1/2019 | Shibata | H01L 27/105 |
| 2020/0082858 | A1* | 3/2020 | Kim | G11C 11/1659 |
| 2021/0158849 | A1* | 5/2021 | Saito | H01L 27/105 |
| 2021/0296575 | A1* | 9/2021 | Kim | H10B 61/00 |

(Continued)

*Primary Examiner* — Kevin M Bernatz
(74) *Attorney, Agent, or Firm* — MARSHALL, GERSTEIN & BORUN LLP

(57) ABSTRACT

A nano spintronic device for using the spin current of a ferromagnetic material and the spin current of a heavy metal channel. The device includes a lower channel layer, a free layer, a pinned layer, an insulating film layer, and an upper channel layer. When current flows upon application of power, electrons are divided into +y-polarized spins and −y-polarized spins in the lower channel layer, thereby generating torque in the free layer. The torque switches the magnetization direction of the free layer to an +y-axis direction or an −y-axis direction so that the free layer stores magnetization information according to the magnetization direction. When current flows in the upper channel layer, the current flows into the pinned layer so that electrons in the pinned layer are divided into +y-polarized spins and −y-polarized spins. The insulating layer insulates the free layer and the pinned layer from each other. When power is supplied, current flows in the upper channel layer and flows into the pinned layer, thereby inducing polarized spins in the pinned layer, resulting in the generation of torque in the free layer.

17 Claims, 5 Drawing Sheets

(56) References Cited

U.S. PATENT DOCUMENTS

2021/0327960 A1\* 10/2021 Xiao ................. H10N 50/85
2022/0149268 A1\* 5/2022 Park .................. G11C 11/1675
2022/0310146 A1\* 9/2022 Xing ................. G11C 11/1657

\* cited by examiner

FIG. 1A
(CONVENTIONAL)
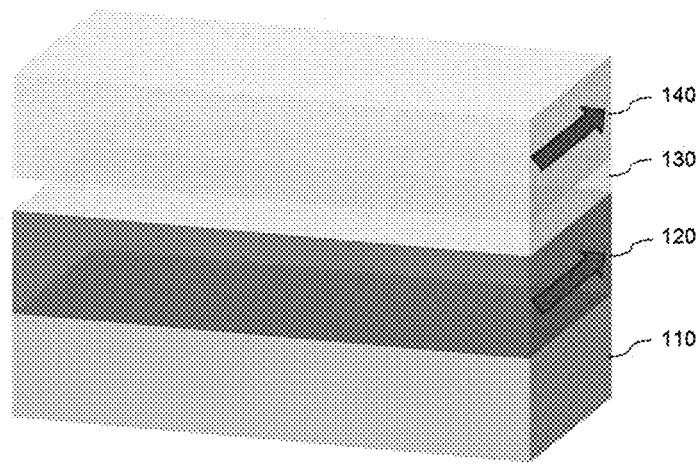
FIG. 1B
(CONVENTIONAL)
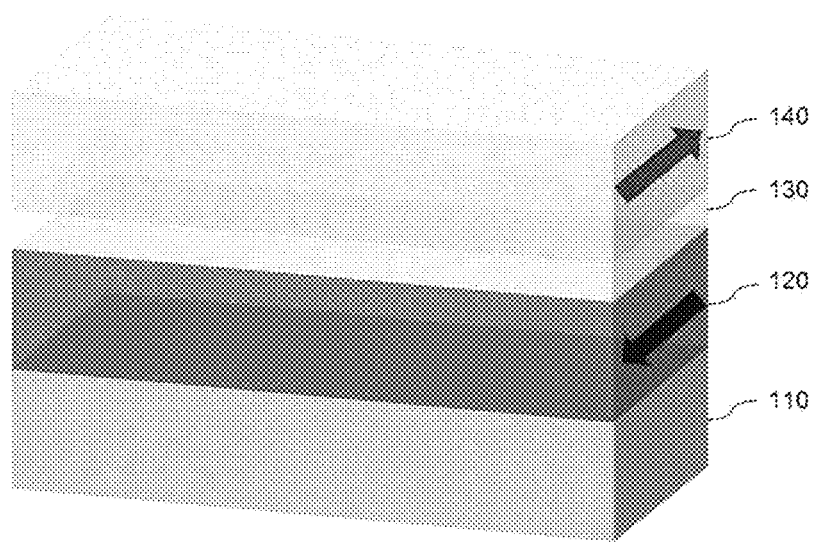

FIG. 2A
(CONVENTIONAL)
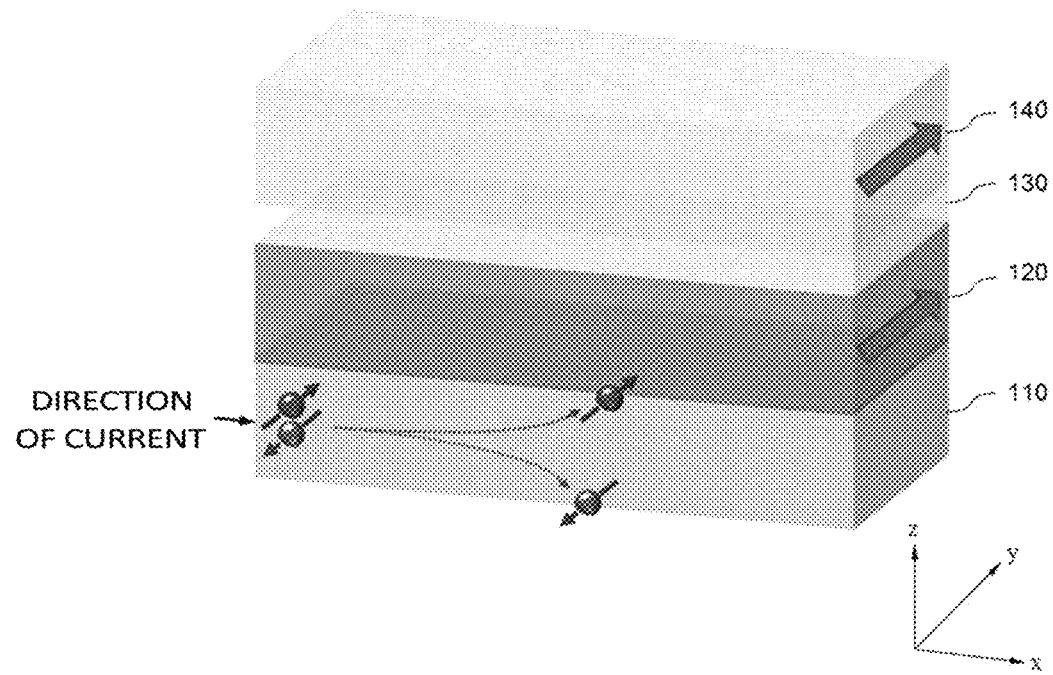
FIG. 2B
(CONVENTIONAL)
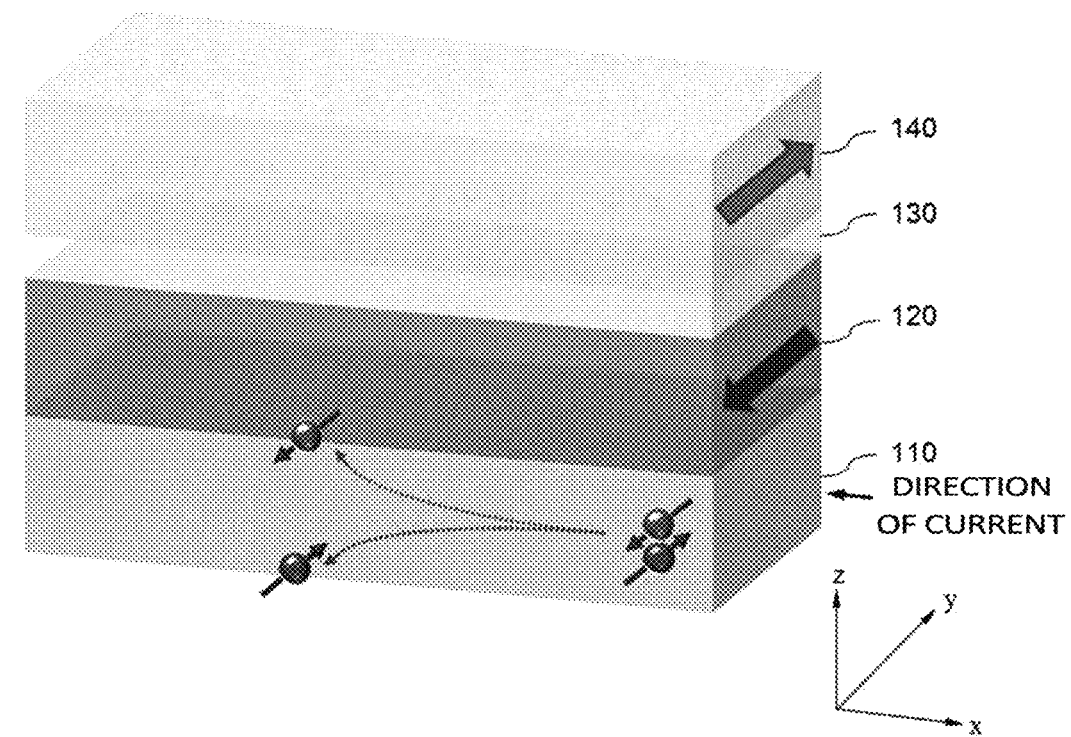

NANO SPINTRONIC DEVICE USING SPIN CURRENT OF FERROMAGNETIC MATERIAL AND HEAVY METAL CHANNEL

CROSS REFERENCE TO RELATED APPLICATION

The present application claims priority to Korean Patent Application No. 10-2021-0086202, filed Jul. 1, 2021, the entire contents of which is incorporated herein for all purposes by this reference.

BACKGROUND OF THE INVENTION

1. Field of the Invention

The present invention relates to a nano spintronic device using the spin current of a ferromagnetic material and a heavy metal channel. More particularly, the present invention relates to a spintronic device using a spin current flowing in a ferromagnetic material and a heavy metal channel, in which current flows in a pinned layer as well as in a channel so that switching in a free layer can be easily performed with a smaller intensity of current.

The present invention was supported by the National Research and Development Program through the National Research Foundation of Korea (NRF) funded by the Ministry of Science and ICT (2019M3F3A1A02071509), a National Research Council of Science & Technology (NST) grant (CAP-16-01-KIST), KIST Institutional Program (2E30600).

2. Description of the Related Art

Recently, a technique of using a spintronic element that stores information by controlling the magnetization direction of a magnetic material has been widely used.

A nano spintronic device using a magnetic material features non-volatility and is one of the promising next-generation information processing devices because it can control information at low power and high speed. The non-volatility of the spintronic element allows the supply of power to circuits that are not involved in a logic operation to be cut off each time the logical operation is performed, thereby lowering standby power and enabling low-power high-efficiency logic operation, a reset function, and high-speed arithmetic operation.

The basic operational principle of a spintronic device is to control spin, which is an intrinsic physical quantity of electrons, with an electrical signal. This requires efficient writing of information by controlling the magnetization direction in a magnetic material with an electrical signal and fast and accurate reading of magnetization information electrically. To this end, the spintronic element typically uses a spin-torque technology, which is a collective term for a spin-transfer torque (STT) and a spin-orbit torque (SOT), for magnetization switching, and a magnetoresistance effect such as a giant magnetoresistance (GMR) effect and a tunneling magnetoresistance (TMR) effect to read magnetization information from a magnetic material.

In a conventional spin-orbit torque memory, switching is performed in a free layer by the spin Hall effect occurring in a channel. A magnetic junction channel stores information on the basis of a resistance value difference between a state in which the magnetization directions of a pinned layer and a free layer are parallel and a state in which the magnetization directions are antiparallel. When the magnetization directions are parallel, the resistance value is relatively small, whereas when the magnetization directions are anti-parallel, the resistance value is relatively large. In general, the pinned layer is used to read the magnetization value of the free layer. Therefore, a relatively large voltage is required for switching for storing magnetization information in the free layer.

On the other hand, Korean Patent Application Publication No. 10-2018-0045302 (Patent Document 1) discloses a spin synapse device using a spin orbit torque and an operation method thereof. The spin synapse device includes: an electrode formed on a substrate; a free layer formed on the electrode and having a movable magnetic domain wall that moves according to a spin orbit torque; a tunnel barrier layer made of a non-magnetic material and formed on the free layer; a first pinned layer formed on the tunnel barrier layer and having a fixed magnetization direction; a spacer layer formed on the first pinned layer; and a second pinned layer formed on the spacer layer.

In the case of the device disclosed in Patent Document 1, since the free layer in which the magnetic domain wall movement occurs according to the spin orbit torque is present, there is an advantage that the magnetization of the free layer can be reversed with a lower intensity of current than a magnetic element using a spin transfer torque. However, since the device has a structure in which the spin orbit torque is generated only at the interface between the electrode and the free layer, there is a problem in that a relatively large voltage needs to be applied to the electrode for the magnetization reversal in the free layer.

SUMMARY OF THE INVENTION

The present invention has been made to solve the problems occurring in the related art described above. According to the present invention, by enabling current to flow not only in a channel but also in a pinned layer, torque is generated in both the upper portion and the lower portion of a free layer so that switching can be easily performed in the free layer with a smaller intensity of current. The objective of the present invention is to provide a nano spintronic device using the spin current of a ferromagnetic material and the spin current of a heavy metal channel.

To accomplish the objective, one aspect of the present invention provides a nano spintronic device using a spin current of a ferromagnetic material and a spin current of a heavy metal channel, the device including: a lower channel layer in which electrons are split into +y polarized spins and −y polarized spins when a current flows upon application of power, and the +y polarized spins or the −y polarized spins generate a torque in a free layer; the free layer formed on an upper surface of the lower channel layer and configured to store magnetization information by switching a magnetization direction to a +y-axis direction or a −y-axis direction according to the torque generated by the lower channel layer; a pinned layer involving in reading the magnetization information of the free layer and configured such that when a current flows in an upper channel layer, the current flows into the pinned layer so that electrons therein are divided into +y polarized spins and −y polarized spins, and the +y polarized spins or the −y polarized spins generates a torque in the free layer; a first insulating film layer formed between the free layer and the pinned layer to insulate the free layer and the pinned layer from each other; and the upper channel layer formed on a predetermined area of an upper surface of the pinned layer and enabling a current to flow in the pinned layer when the current flows upon application of power, thereby inducing spin polarization in the pinned layer to generate a torque in the free layer.

The device may further include a second insulating film layer disposed between the upper channel layer and the lower channel layer to insulate the upper channel layer and the lower channel layer from each other.

The second insulating film layer may be made of a material selected from among $SiO_x$, AlOx, MgO, $HfO_x$, $TiO_x$, and $TaO_x$.

The lower channel layer may have a thickness of 10 nm to several μm.

The lower channel layer may be made of a compound of at least two materials selected from among W, Pt, Au, and Ta.

The lower channel layer may be made of a material selected from among BiSe, BiTe, WSe, WTe, AgTe, graphene, Si, GaAs, and InAs or a compound of at least two materials selected from among BiSe, BiTe, WSe, WTe, AgTe, graphene, Si, GaAs, and InAs.

The lower channel layer may have a heterostructure comprising a plurality of semiconductor layers.

The free layer may have a thickness of 1 nm to 100 nm.

The free layer may be made of a material selected from among Co, Fe, Ni, Tb, Eu, Gd, CoFe, NiFe, CoNi, and CoFeB or a compound of two or more materials selected from among Co, Fe, Ni, Tb, Eu, Gd, CoFe, NiFe, CoNi, and CoFeB.

The free layer may be made of a ferromagnetic oxide formed using a material selected from among Co, Fe, Ni, Tb, Eu, Gd, CoFe, NiFe, CoNi, and CoFeB or a compound of two or more materials selected from among Co, Fe, Ni, Tb, Eu, Gd, CoFe, NiFe, CoNi, and CoFeB.

The pinned layer may be made of a material selected from among Co, Fe, Ni, Tb, Eu, Gd, CoFe, NiFe, CoNi, and CoFeB or a compound of two or more materials selected from among Co, Fe, Ni, Tb, Eu, Gd, CoFe, NiFe, CoNi, and CoFeB.

The pinned layer may be made of a ferromagnetic oxide formed using a material selected from among Co, Fe, Ni, Tb, Eu, Gd, CoFe, NiFe, CoNi, and CoFeB or a compound of two or more materials selected from among Co, Fe, Ni, Tb, Eu, Gd, CoFe, NiFe, CoNi, and CoFeB.

The first insulating film layer may have a thickness of 0.5 to 10 nm.

The first insulating film layer may be made of a material selected from among $SiO_x$, $AlO_x$, MgO, $HfO_x$, $TiO_x$, and $TaO_x$.

The upper channel layer may be made of a material selected from among W, Pt, Au, and Ta or a compound of two or more materials selected from among W, Pt, Au, and Ta.

The upper channel layer may be made of a material selected from among BiSe, BiTe, WSe, WTe, AgTe, graphene, Si, GaAs, and InAs or a compound of two or more materials selected from among BiSe, BiTe, WSe, WTe, AgTe, graphene, Si, GaAs, and InAs.

The upper channel layer may have a heterostructure comprising a plurality of semiconductor layers.

BRIEF DESCRIPTION OF THE DRAWINGS

The above and other objectives, features, and other advantages of the present invention will be more clearly understood from the following detailed description taken in conjunction with the accompanying drawings, in which:

FIGS. 1A and 1B are diagrams schematically illustrating the principle of a magnetic tunnel junction;

FIGS. 2A and 2B are diagrams schematically illustrating the principle of a spin orbit torque;

DESCRIPTION OF THE PREFERRED EMBODIMENTS

Figure 3:
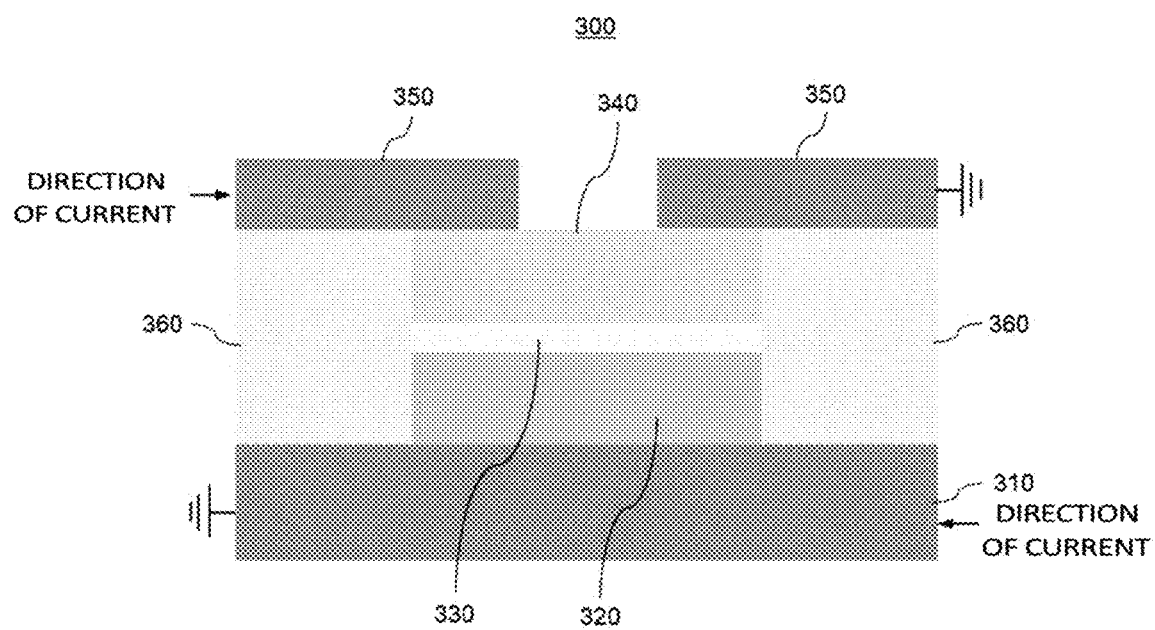
FIG. 3 is a diagram schematically illustrating the structure of a nano spintronic device using a spin current of a ferromagnetic material and a spin current of a heavy metal channel, according to a first embodiment of the present invention.

Hereinafter, embodiments of the present invention will be described in detail with reference to the accompanying drawings.

Prior to describing the embodiments of the present invention in detail, the principles of a magnetic tunnel junction and a spin orbit torque used in the present invention will be briefly described to help the understanding of the present invention.

FIGS. 1A and 1B are diagrams schematically illustrating the principle of a magnetic tunnel junction. FIG. 1A shows a case in which magnetization directions are parallel, and FIG. 1B shows a case in which magnetization directions are antiparallel.

Referring to FIGS. 1A and 1B, a magnetic junction channel stores magnetization information in a free layer 120 on the basis of a resistance difference between a case where the magnetization directions of a pinned layer 140 and the free layer 120 are parallel (as shown in FIG. 1A, the magnetization direction (red arrow) of the pinned layer 140 and the magnetization direction (red arrow) of the free layer 120 are the same) and a case where the magnetization directions are antiparallel (as shown in FIG. 1B, the magnetization direction (red arrow) of the pinned layer 140 and the magnetization direction (red arrow) of the free layer 120 (blue arrow) are opposite to each other. The resistance is relatively small when the magnetization directions are parallel, and the resistance is relatively large when the magnetization directions are antiparallel. In FIGS. 1A and 1B, reference numeral 110 denotes a channel through which current flows when power is applied, and reference numeral 130 denotes an insulating film layer for isolating the pinned layer 140 and the free layer 120 from each other.

FIGS. 2A and 2B are diagrams schematically illustrating the principle of the spin orbit torque. FIG. 2A shows a case in which the magnetization directions are parallel, and FIG. 2B shows a case where the magnetization directions are antiparallel.

Referring to FIG. 2A, a spin orbit coupling torque is divided into a +y polarization spin (red electron and arrow) and a −y polarization spin (blue electron and arrow) when a current flows in the channel layer 110 in an +x-axis direction. In FIG. 2A, the +y-polarized spin generated in the channel layer 110 generates a torque in the free layer 120 to switch the magnetization direction of the free layer 120 to the +y-axis direction.

Referring to FIG. 2B, when the current flows in the opposite direction to that of FIG. 2A, that is, when the current flows in an −x-axis direction, the movement path of the +y polarized spin (red electron and arrow) and the −y polarized spin (blue electron and arrow) are changed. For example, in FIG. 2A, the +y polarized spin (red electron and arrow) bends in a +z direction, and the −y polarized spin (blue electron and arrow) bends in an −z direction. On the other hand, in FIG. 2B, since the direction of the current flow is reversed, the +y polarized spin (red electron and arrow) bends in the −z direction, and the −y polarized spin (blue electron/arrow) bends in the +z direction. In this case, in the channel layer 110, the −y polarized spin generates a torque in the free layer 120 to switch the magnetization direction of the free layer 120 to the −y axis direction. In FIGS. 2A and 2B, reference numeral 130 denotes an insulating film layer for insulating the pinned layer 140 and the free layer 120 from each other.

Hereinafter, embodiments of the present invention will be described on the basis of the principles described above.

FIG. 3 is a diagram schematically illustrating the structure of a nano spintronic device using a spin current of a ferromagnetic and a spin current of a heavy metal channel, according to a first embodiment of the present invention.

Referring to FIG. 3, the nano spintronic device 300 using the spin current of a ferromagnetic material and the spin current of a heavy metal channel, according to the first embodiment of the present invention, includes a lower channel layer 310, a free layer 320, and an insulating film layer (first insulating film layer) 330, a pinned layer 340, and an upper channel layer 350.

In the lower channel layer 310, when a current flows upon the application of power, electrons are divided into +y polarized spins and −y polarized spins, and the +y polarized spins or −y polarized spins generate a torque in the free layer 320. That is, the +y polarized spins or the −y polarized spins are bent in a +z direction or a −z direction to generate a torque in the free layer 320. Here, the lower channel layer 310 may have a thickness of 10 nm to several μm. However, the thickness of the lower channel layer 310 is not necessarily limited thereof, and the thickness may vary depending on the performance or characteristics of applications such as a semiconductor memory device. In addition, the lower channel layer 310 may be formed of any one of W, Pt, Au, and Ta, or a compound in which at least two of these elements are combined. The lower channel layer 310 may be made of any one material selected from among BiSe, BiTe, WSe, WTe, AgTe, graphene, Si, GaAs, and InAs or a compound of at least two substances selected from among BiSe, BiTe, WSe, WTe, AgTe, graphene, Si, GaAs, and InAs. The lower channel layer 310 may have a heterostructure including a plurality of semiconductor layers. However, the material of the lower channel layer 310 is not limited thereto, and any material (conductive material) through which current flows may be used.

The free layer 320 is formed on the upper surface of the lower channel layer 310 and stores magnetization information by switching the magnetization direction to the +y-axis direction or the −y-axis direction by the torque generated by the lower channel layer 310. The free layer 320 may have a thickness of 1 nm to 100 nm. The free layer 320 is not necessarily limited to such a thickness, and the thickness of the free layer 320 may vary depending on the performance or characteristics of applications (for example, a semiconductor memory device). In addition, the free layer 320 may be made of any one of Co, Fe, Ni, Tb, Eu, Gd, CoFe, NiFe, CoNi, and CoFeB or a compound of at least two substances selected from Co, Fe, Ni, Tb, Eu, Gd, CoFe, NiFe, CoNi, and CoFeB. The free layer 320 may be a ferromagnetic oxide layer (for example, $FeO_x$ layer). The material of the free layer 320 is not limited to the materials listed above, and any ferromagnetic material may be used for the free layer 320.

The pinned layer 340 is involved in reading the magnetization information of the free layer 320. However, in the present invention, the pinned layer 340 has a function of writing magnetization information therein as well as a function of reading the magnetization information of the free layer 320. When a current flows in the upper channel layer 350, which will be described later, a current flows into the inner layers so that electrons are divided into +y polarized spins and −y polarized spins, and the +y polarized spins or the −y polarized spins generate a torque in the free layer 320. The pinned layer 340, like the free layer 320, is made of any one of Co, Fe, Ni, Tb, Eu, Gd, CoFe, NiFe, CoNi, and CoFeB or a compound of at least two of them. The pinned layer 340 is a ferromagnetic oxide layer using any one of the Co, Fe, Ni, Tb, Eu, Gd, CoFe, NiFe, CoNi, and CoFeB or a compound of at least two of them. For example, the pinned layer 340 is a $FeO_x$ layer. The material of the pinned layer 340 is not limited to the materials listed above, and any ferromagnetic material may be used for the pinned layer.

The insulating film layer (first insulating film layer) 330 is formed between the free layer 320 and the pinned layer 340 to isolate the free layer 320 and the pinned layer 340 from each other. The insulating film layer (first insulating film layer) 330 may have a thickness of 0.5 to 10 nm. However, the thickness of the insulating film layer is not necessarily limited to such a value and may vary depending on the performance or characteristics of applications. In addition, the insulating film layer (first insulating film layer) 330 as described above may be formed of any one material (oxide) such as $SiO_x$, $AlO_x$, MgO, $HfO_x$, $TiO_x$, and $TaO_x$. The material of the insulating film layer (first insulating film layer) 330 is not limited to the above-mentioned materials, and any oxide may be used as the material of the insulating (first insulating film layer) 330.

The upper channel layer 350 is formed on a certain region of the upper surface of the pinned layer 340. When a current flows upon the application of power, the current flows also in the pinned layer 340, thereby inducing polarized spins in the pinned layer 340 and generating a torque in the free layer 320. Like the lower channel layer 310, the upper channel layer 350 may be formed of any one of W, Pt, Au, and Ta or a compound of at least two of W, Pt, Au, and Ta. The upper channel layer 350 may be made of any one of BiSe, BiTe, WSe, WTe, AgTe, graphene, Si, GaAs, and InAs, or a compound of at least two of them. The upper channel layer 350 may have a heterostructure including a plurality of semiconductor layers. The material of the upper channel layer 350 is also not limited to the materials listed above, and any material (i.e., conductive material) through which current flows may be used.

The nano spintronic device 300 having the structure described above and using the spin current of a ferromagnetic material and the spin current of a heavy metal channel, according to the present invention, preferably further includes an insulating film layer (second insulating film layer) 360 disposed between the upper channel layer 350 and the lower channel layer 310. The insulating film layer (second insulating film layer) 360 isolates the upper channel layer 350 and the lower channel layer 310 from each other. In this case, the insulating film layer (second insulating film layer) 360 may be made of any one of SiOx, AlOx, MgO, HfOx, TiOx, and TaOx like the first insulating film layer 330. However, as described above, the second insulating film layer 360 is not limited to be made of the same material as the first insulating film layer 330. In some cases, the second insulating film layer 360 and the first insulating film layer 330 may be made of different materials.

Figure 4A:
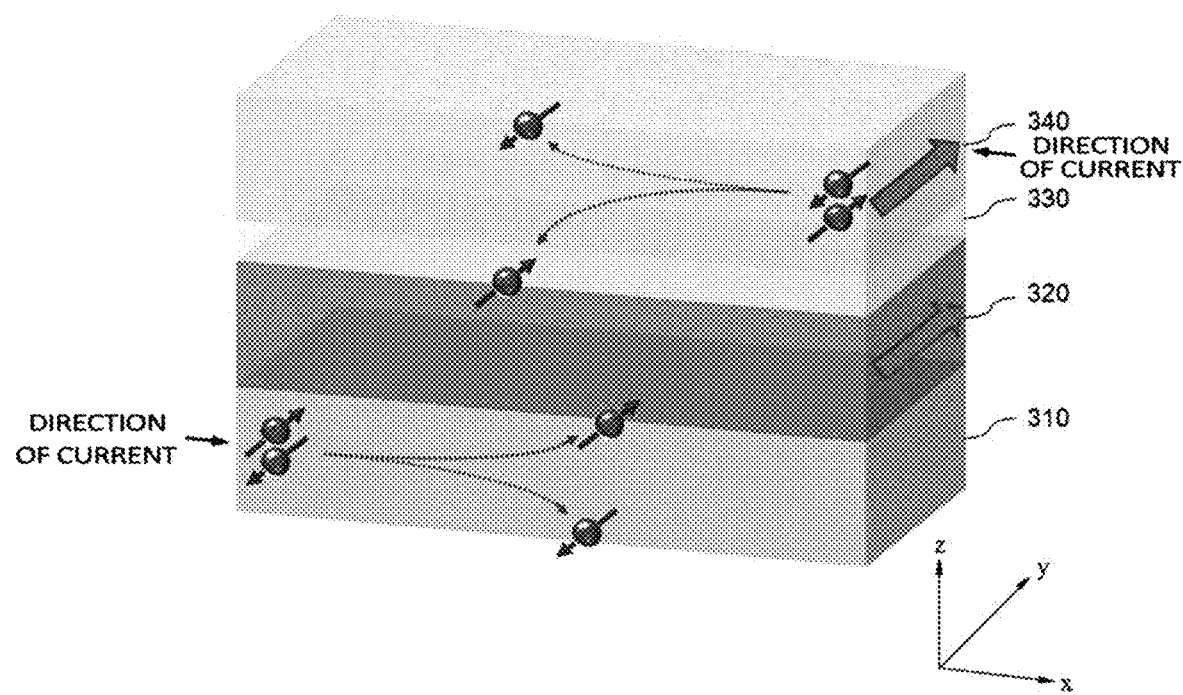
FIGS. 4A and 4B are diagrams schematically illustrating the principle of operation of a nano spintronic device using a spin current of a ferromagnetic material and a spin current of a heavy metal channel, according to the present invention.
Figure 4B:
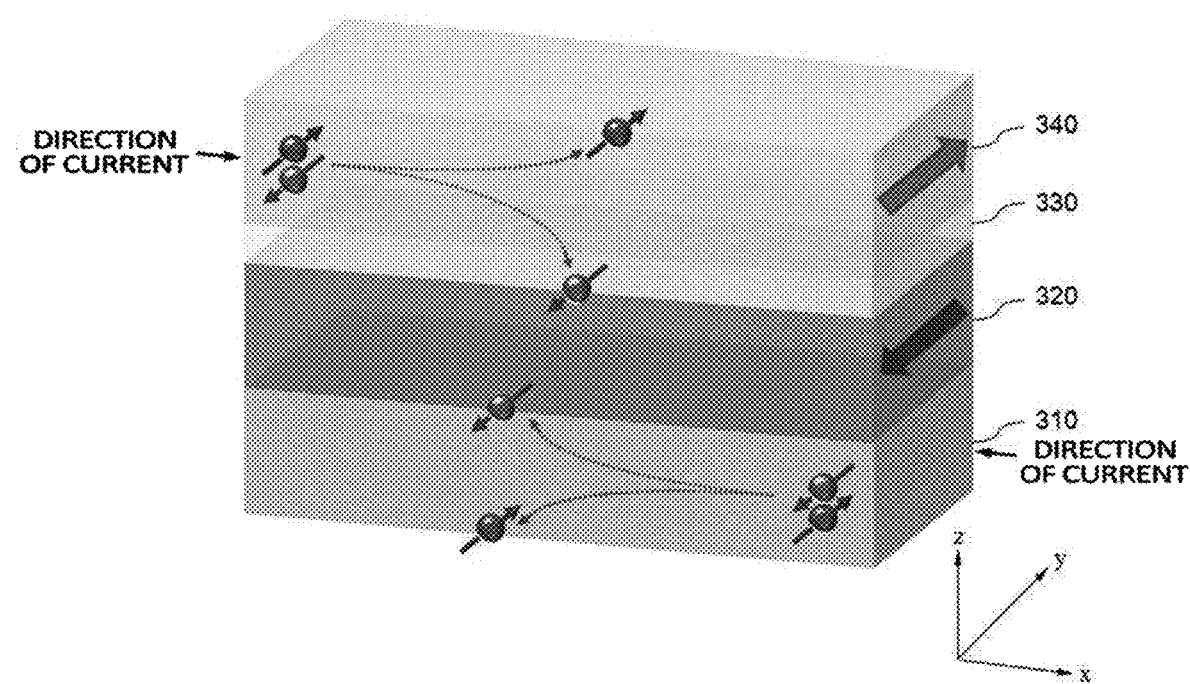

FIGS. 4A and 4B are diagrams schematically illustrating the operating principle of a nano spintronic device using spin currents of a ferromagnetic material and a heavy metal channel, according to the present invention.

FIG. 4A shows a case in which magnetization directions are parallel. Electric current flows in the pinned layer 340 as well as the lower channel layer 310. That is, when electric current flows in the upper channel layer 350, electric current also flows in the same direction in the pinned layer 340. In this case, torque is generated on the upper side and the lower side of the free layer 230 so that the switching of the free layer 320 can be facilitated. In this case, as shown in FIG. 4A, the direction of the current of the lower channel layer 310 and the direction of the current of the pinned layer 340 must be opposite to each other so that the spin polarization (red electron/arrow) in the same direction generates a torque in the free layer 320.

FIG. 4B shows a case where magnetization directions are antiparallel. When the direction of the current shown in FIG. 4A is changed to the direction shown in FIG. 4B, the spin polarization opposite to the spin polarization (red electron/arrow) shown in FIG. 4A generates a torque in the free layer 320, causing the free layer 320 to switch in the direction opposite to the direction shown in FIG. 4A.

Figure 5:
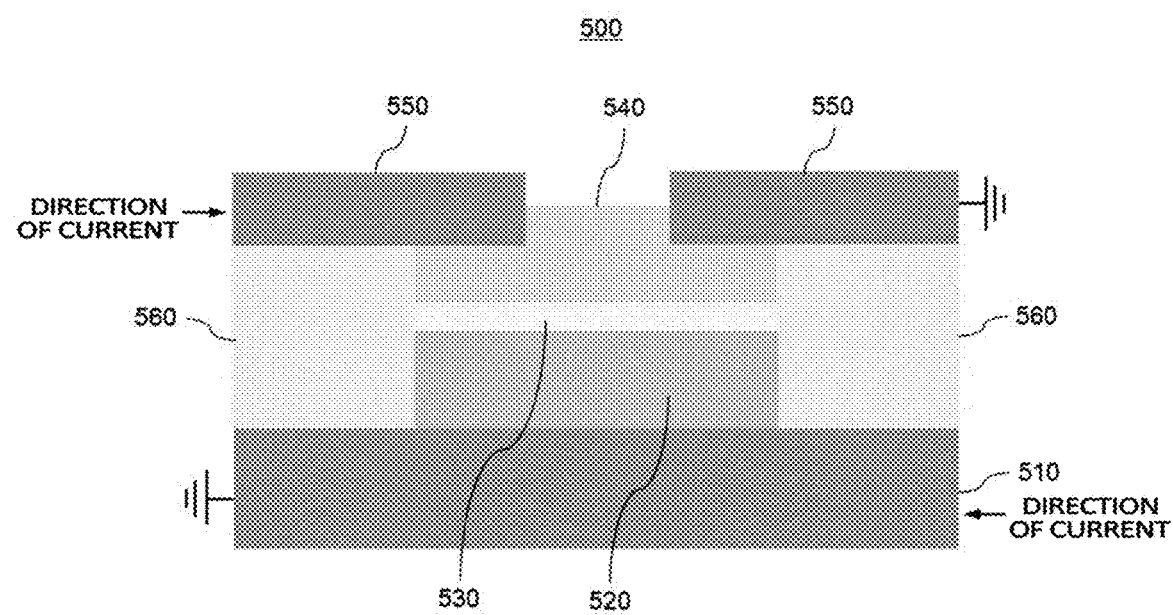
FIG. 5 is a diagram schematically illustrating the structure of a nano spintronic device using a spin current of a ferromagnetic material and a spin current of a heavy metal channel, according to a second embodiment of the present invention.

FIG. 5 is a diagram schematically illustrating the structure of a nano spintronic device using spin the current of a ferromagnetic material and the current of a heavy metal channel, according to a second embodiment of the present invention.

Referring to FIG. 5, the fundamental structure of the nano spintronic device 500 using the spin current of a ferromagnetic material and the spin current of a heavy metal channel, according to the second embodiment of the present invention is the same as that of the nano spintronic device 300 according to the first embodiment described above. However, the nano spintronic device 500 according to the second embodiment, as illustrated in FIG. 5, differs from the nano spintronic device 300 according to the first embodiment in that a portion of the upper channel layer 550 penetrates to a certain depth of the pinned layer 540.

In the nano spintronic device 500 according to the second embodiment, the function, the material, and the structure of each of the lower channel layer 510, the free layer 520, the first insulating film layer 530, the pinned layer 540, the upper channel layer 550, and the second insulating film layer 560 correspond to those of each of the lower channel layer 310, the free layer 320, the insulating film layer 330, the pinned layer 340, the upper channel layer 350, and the second insulating film layer 360 of the nano spintronic device 300 according to the first embodiment, respectively. Accordingly, a detailed description of the function, material, and structure of each of the components of the nano spintronic device according to the second embodiment will be omitted.

Figure 6:
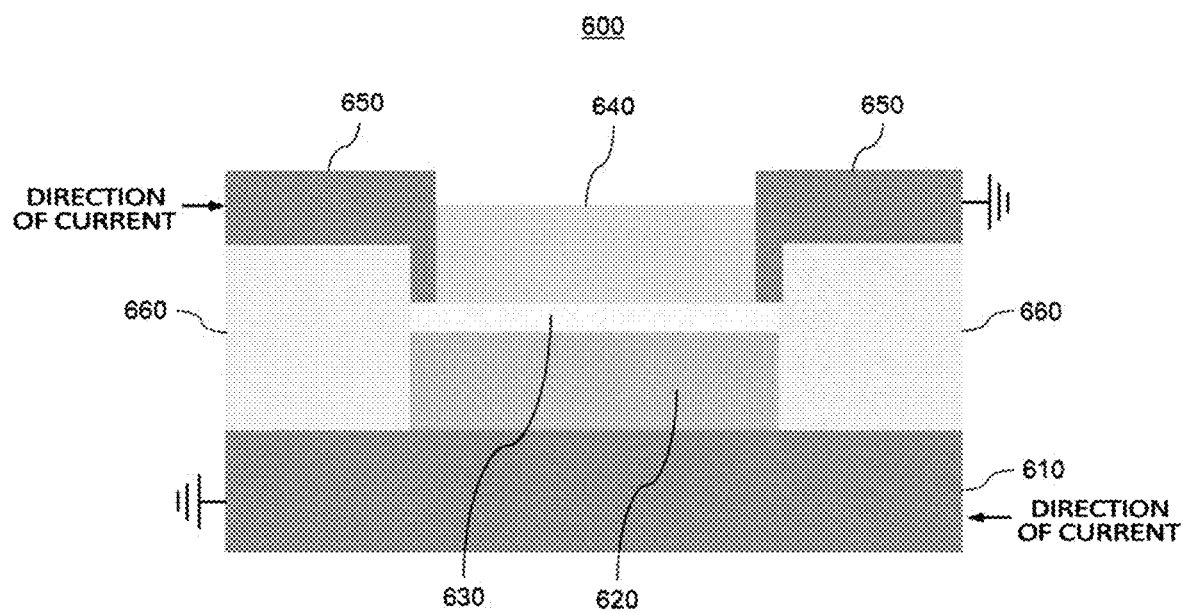
FIG. 6 is a diagram schematically illustrating the structure of a nano spintronic device using a spin current of a ferromagnetic material and a spin current of a heavy metal channel, according to a third embodiment of the present invention.

FIG. 6 is a diagram schematically illustrating the structure of a nano spintronic device using the spin current of a ferromagnetic material and the spin current of a heavy metal channel, according to a third embodiment of the present invention.

Referring to FIG. 6, the fundamental structure of the nano spintronic device 600 according to the third embodiment of the present invention is the same as that of the nano spintronic device 300 according to the first embodiment described above. However, referring to FIG. 6, the nano spintronic device 600 according to the third embodiment differs from the nano spintronic device 300 according to the first embodiment in that an upper channel layer 650 is formed in contact with a side surface of a pinned layer 640.

The function, material, and structure of each of a lower channel layer 610, a free layer 620, a first insulating film layer 630, the pinned layer 640, and the upper channel layer 650, and a second insulating film layer 660 in the nano spin device 600 according to the third embodiment correspond to those of each of and the lower channel layer 310, the free layer 320, the first insulating film layer 330, the pinned layer 340, the upper channel layer 350, and the second insulating film layer 360 in the nano spintronic device 300 according to the first embodiment described above, respectively. Therefore, a detailed description of the function or role of each component of the nano spintronic device 600 according to the third embodiment will be omitted.

Figure 7:
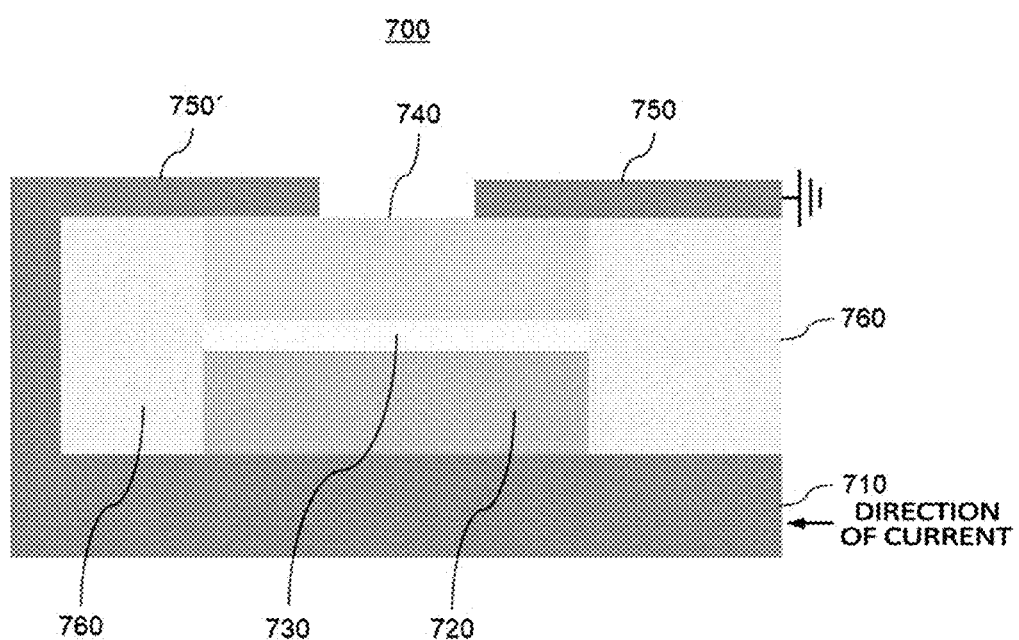
FIG. 7 is a diagram schematically showing the structure of a nano spin device using spin current of a ferromagnetic material and a heavy metal channel according to a fourth embodiment of the present invention.

FIG. 7 is a diagram schematically illustrating the structure of a nano spintronic device using the spin current of a ferromagnetic material and the spin current of a heavy metal channel, according to a fourth embodiment of the present invention.

Referring to FIG. 7, the fundamental structure of the nano spintronic device 700 according to the fourth embodiment of the present invention is the same as that of the nano spintronic device 300 according to the first embodiment described above. However, the nano spintronic device 700 according to the fourth embodiment as shown in FIG. 7 differs from the nano spintronic device 300 according to the first embodiment in that an upper channel layer 750 on one side is formed to be integrated with a lower channel layer 710. In this case, it is possible to make currents in different (opposite) directions always flow through the lower channel layer 710 and the pinned layer 740 with a single power source.

The function and material of each of the lower channel layer 710, a free layer 720, a first insulating film layer 730, the pinned layer 740, an upper channel layer 750, and a second insulating film layer 760 in the nano spintronic device 700 according to the fourth embodiment correspond to the function and material of each of the lower channel layer 310, the free layer 320, the first insulating film layer 330, the pinned layer 340, the upper channel layer 350, and the second insulating film layer 360 in the nano spintronic device 300 according to the first embodiment described above, respectively. Therefore, a detailed description of the function and material of each component of the nano spintronic device 600 will be omitted.

As described above, in the nano spintronic device using the spin current of a ferromagnetic material and the spin current of a heavy metal channel, according to the present invention, torque is generated on the upper side and the lower side of the free layer due to the current flowing not only in the channel layer but also in the pinned layer. Therefore, the free layer can be easily switched with a smaller intensity of current.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A nano spintronic device using a spin current of a ferromagnetic material and a spin current of a heavy metal channel, the device comprising:
    a lower channel layer in which electrons are split into +y polarized spins and −y polarized spins when a current flows upon application of power, and the +y polarized spins or the −y polarized spins generate a torque in a free layer;
    the free layer formed on an upper surface of the lower channel layer and configured to store magnetization information by switching a magnetization direction to a +y-axis direction or a −y-axis direction according to the torque generated by the lower channel layer;
    a pinned layer involving in reading the magnetization information of the free layer and configured such that when a current flows in an upper channel layer, the current flows into the pinned layer so that electrons therein are divided into +y polarized spins and −y polarized spins, and the +y polarized spins or the −y polarized spins generates a torque in the free layer;
    a first insulating film layer formed between the free layer and the pinned layer to insulate the free layer and the pinned layer from each other; and
    the upper channel layer comprising two separate portions formed on a predetermined area of an upper surface of the pinned layer and enabling a current to flow in the pinned layer when the current flows upon application of power, thereby inducing spin polarization in the pinned layer to generate a torque in the free layer.

2. The device according to claim 1, further comprising a second insulating film layer disposed between the upper channel layer and the lower channel layer to insulate the upper channel layer and the lower channel layer from each other.

3. The device according to claim 2, wherein the second insulating film layer is made of a material selected from among $SiO_x$, $AlO_x$, MgO, $HfO_x$, $TiO_x$, and $TaO_x$.

4. The device according to claim 1, wherein the lower channel layer has a thickness of 10 nm to 2 μm.

5. The device according to claim 1, wherein the lower channel layer is made of a material selected from among W, Pt, Au, and Ta or a compound of at least two materials selected from among W, Pt, Au, and Ta.

6. The device according to claim 1, wherein the lower channel layer is made of a material selected from among BiSe, BiTe, WSe, WTe, AgTe, graphene, Si, GaAs, and InAs or a compound of at least two materials selected from among BiSe, BiTe, WSe, WTe, AgTe, graphene, Si, GaAs, and InAs.

7. The device according to claim 1, wherein the lower channel layer has a heterostructure comprising a plurality of semiconductor layers.

8. The device according to claim 1, wherein the free layer has a thickness of 1 nm to 100 nm.

9. The device according to claim 1, wherein the free layer is made of a material selected from among Co, Fe, Ni, Tb, Eu, Gd, CoFe, NiFe, CoNi, and CoFeB or a compound of two or more materials selected from among Co, Fe, Ni, Tb, Eu, Gd, CoFe, NiFe, CoNi, and CoFeB.

10. The device according to claim 9, wherein the free layer is made of a ferromagnetic oxide formed using a material selected from among Co, Fe, Ni, Tb, Eu, Gd, CoFe, NiFe, CoNi, and CoFeB or a compound of two or more materials selected from among Co, Fe, Ni, Tb, Eu, Gd, CoFe, NiFe, CoNi, and CoFeB.

11. The device according to claim 1, wherein the pinned layer is made of a material selected from among Co, Fe, Ni, Tb, Eu, Gd, CoFe, NiFe, CoNi, and CoFeB or a compound of two or more materials selected from among Co, Fe, Ni, Tb, Eu, Gd, CoFe, NiFe, CoNi, and CoFeB.

12. The device according to claim 11, wherein the pinned layer is made of a ferromagnetic oxide formed using a material selected from among Co, Fe, Ni, Tb, Eu, Gd, CoFe, NiFe, CoNi, and CoFeB or a compound of two or more materials selected from among Co, Fe, Ni, Tb, Eu, Gd, CoFe, NiFe, CoNi, and CoFeB.

13. The device according to claim 1, wherein the first insulating film layer has a thickness of 0.5 to 10 nm.

14. The device according to claim 1, wherein the first insulating film layer is made of a material selected from among $SiO_x$, $AlO_x$, MgO, $HfO_x$, $TiO_x$, and $TaO_x$.

15. The device according to claim 1, wherein the upper channel layer is made of a material selected from among W, Pt, Au, and Ta or a compound of two or more materials selected from among W, Pt, Au, and Ta.

16. The device according to claim 1, wherein the upper channel layer is made of a material selected from among BiSe, BiTe, WSe, WTe, AgTe, graphene, Si, GaAs, and InAs or a compound of two or more materials selected from among BiSe, BiTe, WSe, WTe, AgTe, graphene, Si, GaAs, and InAs.

17. The device according to claim 1, wherein the upper channel layer has a heterostructure comprising a plurality of semiconductor layers.

* * * * *